United States Patent [19]
Koese

[11] Patent Number: 4,872,788
[45] Date of Patent: Oct. 10, 1989

[54] MULTI-SPINDEL DRILLING MACHINE

[76] Inventor: Gerrit C. Koese, Steijnstraat 6, 953 RE Baflo, Netherlands

[21] Appl. No.: 304,650

[22] Filed: Feb. 1, 1989

Related U.S. Application Data

[63] Continuation of Ser. No. 137,598, Dec. 24, 1987, abandoned.

[51] Int. Cl.$^4$ .............................................. B23B 39/16
[52] U.S. Cl. ...................................... 408/46; 408/48; 408/127
[58] Field of Search ...................... 408/46, 48, 42, 127

[56] References Cited
U.S. PATENT DOCUMENTS
3,682,560 8/1972 Suizu ...................................... 408/46

Primary Examiner—Bruce Y. Arnold
Assistant Examiner—J. P. Ryan
Attorney, Agent, or Firm—Finnegan, Henderson, Farabow, Garrett & Dunner

[57] ABSTRACT

A multi-spindle drilling machine for simultaneously drilling a plurality of holes, in particular suitable for drilling a plurality of tiny, closely-spaced holes, comprising a drivable drive wheel coacting with a plurality of friction wheels, each connected to a flexible spindle, whose ends away from the friction wheels extend through bores in a spaced apart spindle guide block. Said bores correspond with opposite bores in a drill guide block and are disposed in accordance with the pattern of the holes to be drilled. A coupling arrangement is provided in the space between the drill guide block and the spindle guide block for connecting the shanks of drill bits placed in the bores of the drill guide block to the spindles.

18 Claims, 5 Drawing Sheets

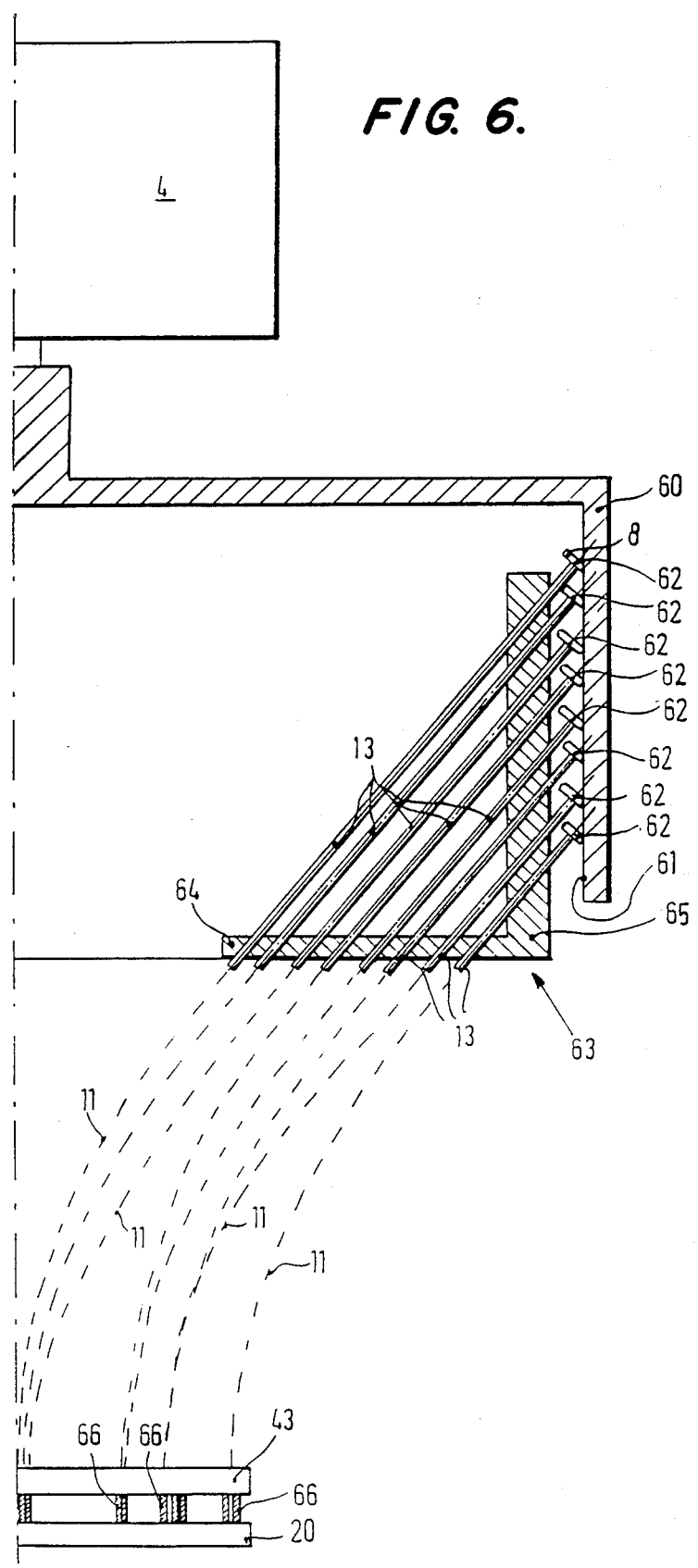

MULTI-SPINDEL DRILLING MACHINE

This application is a continuation of application Ser. No. 07/137,598, filed Dec. 24, 1987, abandoned.

This invention relates to a multi-spindle drilling machine for simultaneously drilling a plurality of holes, in particular suitable for drilling a plurality of tiny, close spaced holes.

Multi-spindle drilling machines are known per se, but the known machines are not very suitable for accurately drilling tiny holes, such as are necessary e.g. for drilling holes in printed circuit boards, in an artificial cornea, or in an interocular lens. Such holes have a cross section generally less than 1 mm. In an artificial cornea for instance holes of about 0.3 mm are drilled and in a printed circuit board holes of about 0.7 mm.

It is accordingly an object of the present invention to provide a multi-spindle drilling machine which is particularly suitable for simultaneously and accurately drilling a plurality of tiny holes according to a predetermined pattern.

To this end, according to the present invention, a drilling machine of the above described type is characterized by a drivable drive wheel coacting with a plurality of friction wheels, each coupled to a flexible spindle whose ends away from the friction wheels extend through bores in a spaced apart spindle guide block, said bores corresponding with opposite bores in a drill guide block and being disposed according to the pattern of the holes to be drilled, while in the space between the drill guide block and the spindle guide block, there are provided coupling means for connecting the shanks of drill bits placed in the bores of the drill guide block to the spindles.

Some embodiments of the present invention will now be described, by way of example, with reference to the accompanying drawings, in which.

Figure 1:
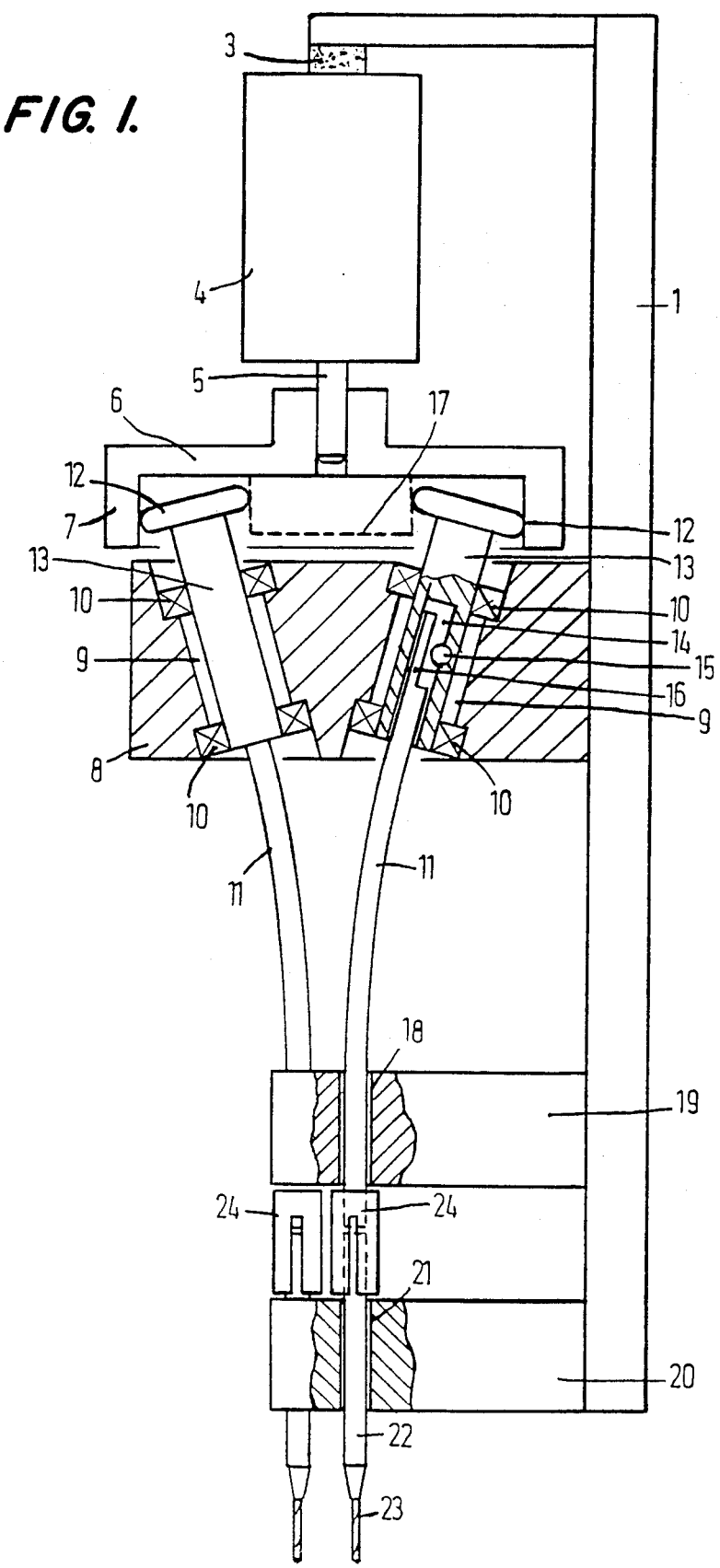
FIG. 1 is a diagrammatic, part-sectional side view of an embodiment of a drilling machine according to the present invention.

FIG. 1 diagrammatically shows a first embodiment of a multispindle drilling machine according to the present invention. The drilling machine shown comprises a substantially vertically extending frame I having an upper transverse arm 2. Suspended from said arm, by means of a preferably slightly flexible connecting piece 3, is a drive motor 4 having a downwardly extending driven shaft 5. Attached to shaft 5 is a drive wheel 6 provided in the embodiment shown with a depending circumferential flange 7, so that the drive wheel is cup-shaped with an inverted U-shaped configuration in cross-section. Underneath drive wheel 6, a bearing block 8 is attached to frame 1, said block containing a plurality of bores 9 corresponding with the maximum number of spindles of the drilling machine. Mounted in bores 9 by means of bearings 10 are drive means, each adapted to receive one end of a downwardly extending spindle 11 to be driven. The drive means each comprise a small friction wheel 12 coacting through friction with the inner wall of flange 7 of the drive wheel. Each friction wheel is attached to the top end of a stud 13 drilled from the other end for forming an axial blind bore 14 adapted to receive the end of a spindle to be driven. To permit the spindle to be thus driven, spindle 11 is coupled to stud 13 so as to be restrained from rotation. To that end, various known techniques can be used. In the embodiment shown, each stud 13 has a tangential bore intersecting bore 14, said tangential bore containing a pin 15 coacting with a flattended portion 16 of the end of a spindle. This construction allows a spindle to be mounted or removed in a simple manner.

The bores 9 are preferably slightly inclined, as shown, and are spaced further apart at the end of bearing block 8 proximal to drive wheel 6 than at the end of the bearing block remote from the drive wheel. In this manner, on the one hand, there is sufficient space available for the small friction wheels 12 and on the other hand, with the use of flexible spindles to be described hereinafter, closely-spaced holes can be simultaneously drilled. Also, in this manner, a relatively low speed of the drive motor, will suffice. A further advantage is that a cup-shaped drive wheel as shown offers protection against penetrating dirt. In principle, however, it is possible to have the friction wheels coact with the outer surface of a drive wheel, as shown in broken lines at 17.

As already observed, spindles 11 are flexible. For this purpose the spindles could take the form of milometer cable. This has the drawbacks of being relatively expensive and, to prevent oscillations, requiring an outer cable which has to be secured separately and leads to a relatively thick spindle. In order that holes may be drilled in closely-spaced relationship, the spindles should have a thickness that is as small as possible.

According to a further elaboration of the present invention, therefore, the spindles take the form of thin, solid rods having a thickness which may be in the order of 1 mm. Due to the small thickness, the spindles are sufficiently flexible to be used in bent condition. Besides, such solid spindles are relatively inexpensive and easy to machine. Practice has shown that the solid spindles are not set vibrating or oscillating, so that an additional guide sleeve is not necessary. Instead of solid spindles, tubular spindles can be employed.

Figure 2:
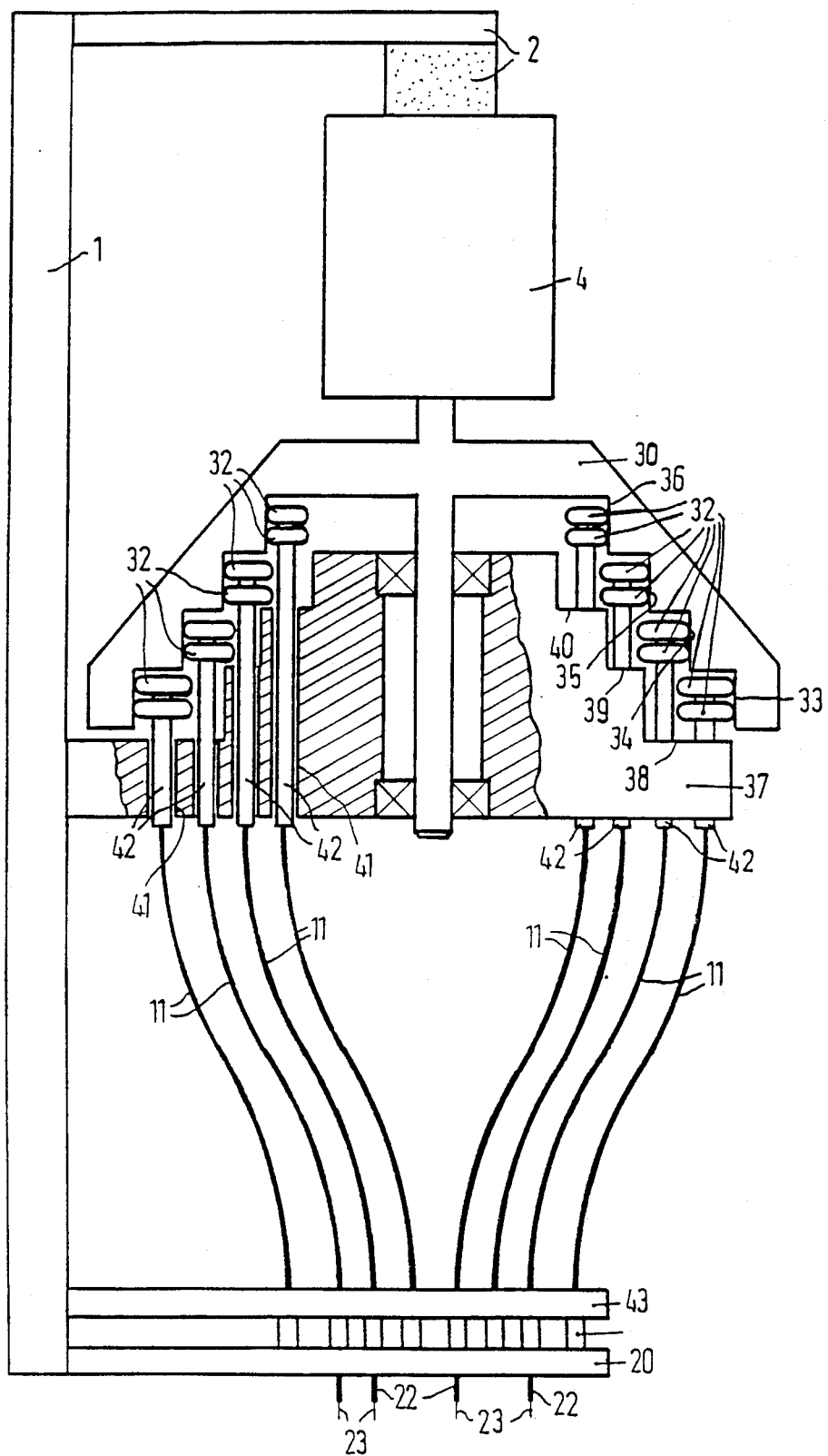
FIG. 2 shows a variant of the drilling machine of FIG. 1.

The spindles 11 extend from bearing block 8 downwards and extend with the ends remote from the bearing block into bores 18 in a spindle guide block 19 attached to frame 1 some distance below the bearing block. Bores 18 are vertical and can lie closer to each other than bores 9. The pattern of the bores 18 corresponds with the pattern of the holes to be drilled, so that in principle, bores 18 might be spaced further apart than bores 9. In general, the pattern of bores 18, however, is not congruent to that of bores 9, so that even in case bores 9 are not inclined, the spindles assume a bent position, as shown in FIGS. 1 and 2.

Some distance underneath the spindle guide block 19 there is mounted on frame 1 a drill guide block 20 containing a pattern of bores 21 corresponding with the pattern of bores 18 in the spindle guide block. Bores 21 are adapted to receive the shank 22 of a drill bit 23.

In the space between the spindle guide block and the drill guide block, each spindle 11 is connected to the shank of a drill bit 23 by means of a connecting sleeve 24 so as to be restrained from rotation. Instead of a connecting sleeve having a split end clamping about a drill bit, as shown, other connecting means may be used, such as choking springs. The connecting means may be connected to the spindles e.g. by soldering or gluing.

The spindle guide block and the drill guide block are attached detachably to the frame and can be exchanged in a simple manner for blocks having a different bore pattern if a different hole pattern is to be drilled.

It is also possible to use drill guide blocks and spindle guide blocks with a large number of holes therein to produce a master pattern. By fitting spindles and drill bits in the proper place in bores of the spindle guide block, and the drill guide block, respectively, the desired bore pattern can then be set.

It will then also be possible to employ a large number of spindles and to fit a drill bit only at the places corresponding with the desired bore pattern. The spindles not used can then remain in position or may be removed.

The drilling machine shown in FIG. 1 is designed for drilling a pattern of a small number of holes (e.g. four holes) as required for instance for artificial corneas. Up to now, holes have been made in artificial corneas by hand, one at a time, which is inaccurate and time-consuming, and whereby sometimes artificial corneas got lost owing to a hole being made too close to the edge and being torn. These problems are substantially avoided when use is made of a drilling machine according to the present invention.

FIG. 2 shows a different embodiment of a drilling machine according to the present invention, which is particularly suitable for simultaneously drilling large numbers of tiny holes according to a predetermined pattern. Such a drilling machine may be employed e.g. for drilling holes patterns in printed circuit boards on which integrated circuits have to be mounted.

Figure 3:
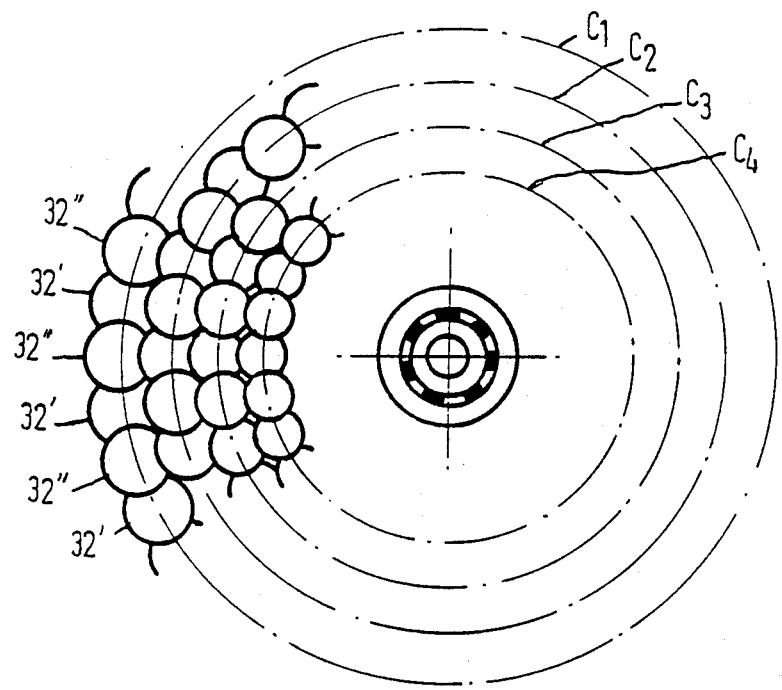
FIG. 3 is a detail top view of the drilling machine of FIG. 2.

The drilling machine shown in FIG. 2 differs from that of FIG. 1 in that the cup-shaped drive wheel, shown in FIG. 2 at 30, is now designed in such a manner that the inner wall of the depending flange 31 is adapted to coact simultaneously with a large number of small friction wheels 32. FIG. 3 is a top view of the configuration of the small friction wheels.

The drive wheel 30 in the embodiment shown in FIG. 2 has a stepped configuration to produce four separate vertical concentric friction surfaces 33-36, each adapted to coact with a plurality of friction wheels. Bearing block 37 also has a stepped configuration with a plurality of horizontal concentric surfaces 38-40, in which vertical bores 41 terminate, wherein again the studs 42 supporting the friction wheels 32 are mounted. In this manner, a large number of spindles 11 can be driven simultaneously. To increase the number of simultaneously drivable spindles still further, adjacent friction wheels coacting with the same friction surface of the drive wheel are mounted in off-set relationship, as once again shown in FIG. 3 at 32' and 32". The adjoining friction wheels can thus overlap slightly in top view.

As shown in FIG. 3, the friction wheels are arranged concentric circles $C_1, C_2, C_3$ and $C_4$.

Figure 4:
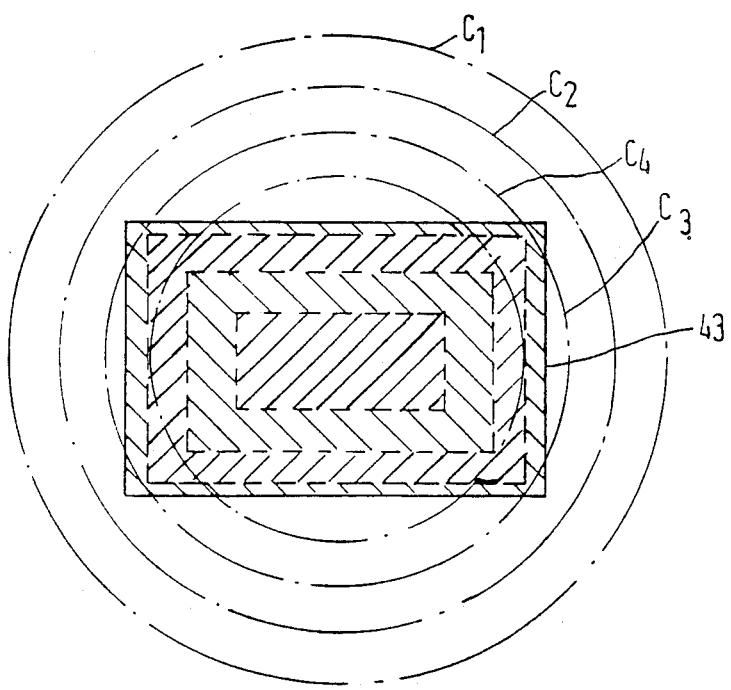
FIG. 4 shows a further detail of the drilling machine of FIG. 2.

FIG. 4 shows a spindle guide block 43 usable in the machine shown in FIG. 2, as well as its location relative to circles $C_1$–$C_4$. For the sake of clarity, the holes are not shown. The drill guide block again has the same form as the spindle guide block.

The spindle guide block, in this embodiment, is rectangular in shape and has four areas $A_1$–$A_4$ surrounding each other. The spindles associated with the friction wheels of circle C terminate in area $A_1$, the spindles of $C_2$ in area $A_2$, etc.

The spindle guide block 43 is again smaller than bearing block 37, so that the spindles will generally be bent, as shown in FIG. 2.

Figure 5:
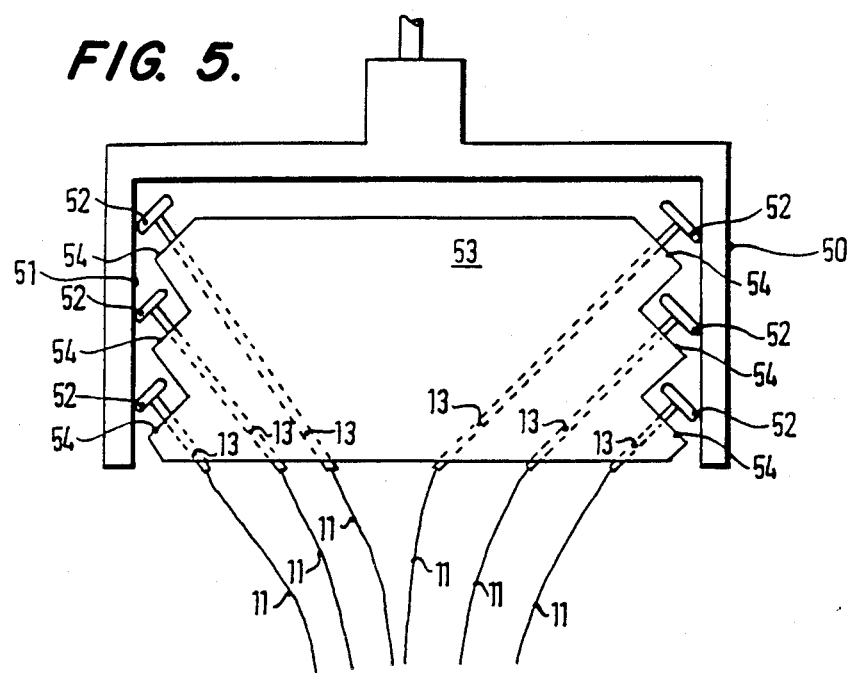

FIGS. 5 and 6 diagrammatically show two variants of the drilling machine shown in FIG. 2. The drilling machines shown in FIGS. 5 and 6 are also suitable for simultaneously drilling a large number of holes but are arranged to that the spindles are not bent into an S-shape.

The dirlling machine shown in FIG. 5 has an inverted cup-shaped, drive wheel 50 with a cylindrical inner wall 51 having such a height that a plurality of small friction wheels 52 can engage, in superposed relationship, with the inner wall. Bearing block 53 is disc-shaped and in this embodiment has a stepped outer wall forming annular faces 54 in which terminate bores extending transversely to said faces to receive studs 13 extending between friction wheels 52 and spindles 11.

In this embodiment the friction wheels are at an angle to the inner surface 51 of the cup-shaped drive wheel 50. When the inner wall of the large drive wheel has a stepped configuration, with a form complementary to the drawn form of the bearing block, the friction wheels are again transverse to a driving friction face. In that case, if desired, the friction can be increased in a simple manner by providing each stud 13 with a plurality of friction wheels in superposed relationship, or by using friction wheels having a larger axial dimension on which a plurality of O-rings can be superimposed.

FIG. 6 shows a variant of the drilling machine of FIG. 5, wherein a cup-shaped bearing block 63 is used which lies within an inverted cup-shaped drive wheel 60. Bearing block 63 has a bottom 64 and an upright wall 65.

Each stud 13 of a spindle 11 is therefore mounted in two aligned bores, one bore being disposed in the bottom 64 and the other in the wall 65 of bearing block 63.

The small friction wheels 62 on studs 13 are at an angle to friction surface 61 of the drive wheel. The surface 6 may have a stepped configuration, so that the friction wheels come to be positioned transversely to a driving surface.

FIG. 6 shows diagrammatically at 66 the above mentioned choking springs for coupling the spindles to the drill bits.

In an embodiment reduced to practice, a drilling machine according to FIG. 6 may have a drive wheel 60 having an inside diameter of 200 mm, six hundred friction wheels having a diameter or 14 mm, arranged in eight levels, as shown, with seventy-five wheels at each level.

Consequently, such a machine allows drilling maximally 600 holes simultaneously.

Studs 13 can be mounted in the bores in the bearing block by means of miniature ball bearings, but plain bearings or a combination of the two can be used instead.

Figure 7:
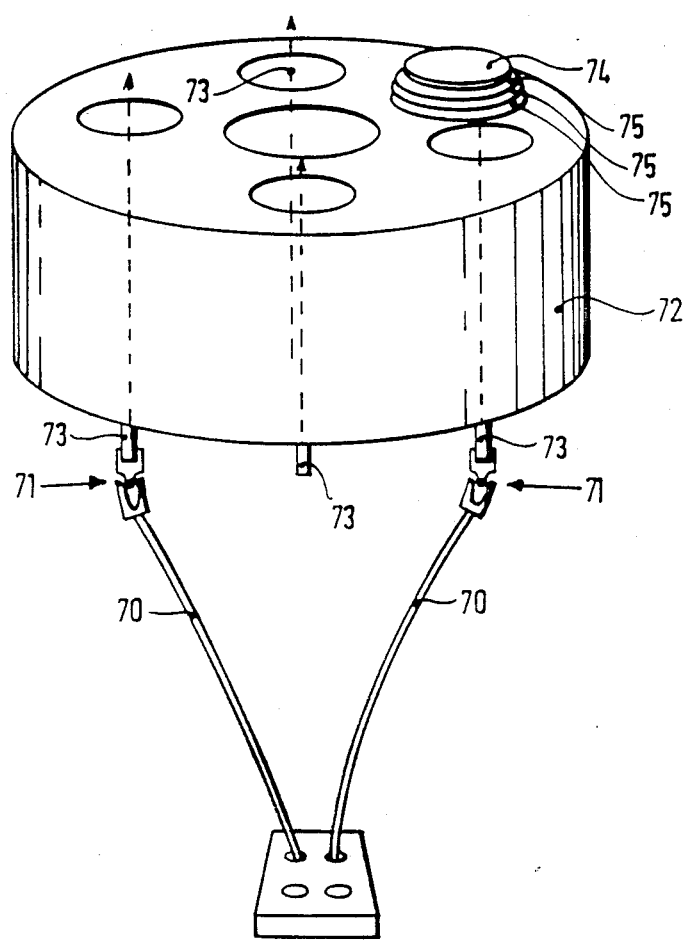

FIG. 7 diagrammatically shows a drilling machine according to the present invention wherein thicker flexible, hollow or solid spindles 70 are employed. The thickness of the spindles may be e.g. 5 mm. The machine shown is arranged for four spindles, two thereof being shown. Spindles 70 are connected through universal joints or homokinetic joints 71 to drive studs 73 mounted in a bearing block 72, said studs carrying in turn friction wheels 74, one of which is shown. The friction wheels, in their turn, coact with a drive wheel, not shown. In the embodiment shown, friction wheel 74 is provided with three superposed rubber rings 75, so that a relatively large driving force can be transmitted. The number of rubber rings per friction wheel can be adapted to the requirements of a specific practical application.

In practice, the drilling machine according to the present invention is preferably placed in a removable housing, not shown, from which only the drill bits project outwardly. The drilling machine can be of a very small construction having a length of e.g. about 25 cm and a cross section of 5-6 cm. and can be hand-held in a simple manner or be placed in a suitable drill pillar. Preferably, one of the commercially available miniature motors is used as drive motor.

It is observed that the drilling machine is highly suitable for drilling a plurality of tiny closely-spaced holes simultaneously. The drilling machine, however, can also be designed to drill more widely spaced and/or larger holes.

It is further observed that, after the foregoing, various modifications are readily apparent to one skilled in the art. For instance, in FIG. 2, the substantially complementary forms of the drive wheel and the bearing block can be inter-changed, so that the friction wheels coact with outer surfaces of the drive wheel. Such modifications are deemed to lie within the scope of the present invention.

I claim:

1. A multi-spindle drilling machine for simultaneously drilling a plurality of holes, in particular suitable for drilling a plurality of tiny, closely-spaced holes, characterized by a cup-shaped drivable drive wheel, the inner wall of the drive wheel coacting with a plurality of friction wheels, each connected to a flexible spindle, whose ends away from the friction wheels extend through bores in a spaced apart spindle guide block, which bores correspond with opposite bores in a drill guide block and are disposed in accordance with the pattern of the holes to be drilled, coupling means being provided in the space between the drill guide block and the spindle guide block for connecting the shanks of drill bits placed in the bores of the drill guide block to the spindles.

2. A drilling machine according to claim 1, characterized in that at least some of flexible spindles are bent in the mounted position.

3. A drilling machine according to claim 1, characterized in that each spindle is a thin solid rod.

4. A drilling machine according to claim 1, characterized in that each spindle is a hollow tube.

5. A drilling machine according to claim 4, characterized in that the spindle and the stud are coupled by means of a homokinetic joint.

6. A drilling machine according to claim 4, characterized in that the spindle and the stud are coupled by means of a universal joint.

7. A drilling machine according to claim 1, characterized in that each friction wheel is mounted on one end of a stud disposed in a bore in a bearing block, said stud being provided on the other end with means for receiving a spindle, secured against rotation.

8. A drilling machine according to claim 7, characterized in that the means for receiving a spindle secured against rotation comprise an axial blind bore in the stud and a tangential bore intersecting the axial bore, wherein a pin is received that coacts with a flattened portion of the corresponding end of the spindle.

9. A drilling machine according to claim 7, characterized in that the bores in the bearing block are placed at an angle.

10. A drilling machine according to claim 4, characterized in that the bearing block is cup-shaped, having a bottom and an upright wall and that oblique bores are provided in the bottom, each in alignment with an oblique bore in the upright wall, with a stud being mounted in each pair of aligned bores.

11. A drilling machine according to claim 1, characterized in that the drive wheel has a stepped wall for forming a plurality of concentric, superposed surfaces, each being adapted to coact with a plurality of friction wheels.

12. A drilling machine according to claim 1, characterized in that adjacent friction wheels are mounted in offset relationship.

13. A drilling machine according to claim 11 or 12, characterized in that there is included a disc-shaped bearing block having a stepped configuration substantially complementary to the wall of the drive wheel.

14. A drilling machine according to claim 11, characterized in that adjacent friction wheels coacting with the same concentric surface of the drive wheel are mounted in offset relationship.

15. A drilling machine according to claim 1, characterized in that the spindle guide block and the drill guide block are mounted detachably and can be replaced by corresponding blocks having a different bore pattern.

16. A drilling machine according to claim 1, characterized by a flexible frame-suspended miniature drive motor on whose output shaft the drive wheel is mounted.

17. A drilling machine according to claim 1, characterized in that the coupling means for connecting the drill bits to the spindles comprise choking springs.

18. A drilling machine according to claim 1, characterized in that each friction wheel is arranged to be provided at choice with one or more O-rings in superposed relationship.

* * * * *

UNITED STATES PATENT AND TRADEMARK OFFICE
CERTIFICATE OF CORRECTION

PATENT NO. : 4,872,788

DATED : Oct. 10, 1989

INVENTOR(S) : Gerrit C. Koese

It is certified that error appears in the above-identified patent and that said Letters Patent is hereby corrected as shown below:

On the title page, item [76], in the inventor's address, "953" should be --9953--.

Signed and Sealed this

Thirtieth Day of October, 1990

Attest:

HARRY F. MANBECK, JR.

*Attesting Officer*  *Commissioner of Patents and Trademarks*